US006878962B1

(12) United States Patent
Kawasaki et al.

(10) Patent No.: US 6,878,962 B1
(45) Date of Patent: Apr. 12, 2005

(54) SEMICONDUCTOR DEVICE

(75) Inventors: Masashi Kawasaki, Sagamihara (JP); Hideo Ohno, Sendai (JP); Akira Ohtomo, Yamato (JP)

(73) Assignee: Japan Science and Technology Corp., Saitama (JP)

( * ) Notice: Subject to any disclaimer, the term of this patent is extended or adjusted under 35 U.S.C. 154(b) by 0 days.

(21) Appl. No.: 09/926,186

(22) PCT Filed: Mar. 22, 2000

(86) PCT No.: PCT/JP00/01736

§ 371 (c)(1),
(2), (4) Date: Jan. 14, 2002

(87) PCT Pub. No.: WO00/59039

PCT Pub. Date: Oct. 5, 2000

(30) Foreign Application Priority Data

Mar. 25, 1999 (JP) ............................................. 11-082043

(51) Int. Cl.$^7$ ..................... H01L 29/12; H01L 31/0256; H01L 27/15; H01L 23/62
(52) U.S. Cl. .............................. 257/43; 257/76; 257/79; 257/352
(58) Field of Search ............................ 257/43, 76, 78, 257/79, 190, 289, 352, 410

(56) References Cited

U.S. PATENT DOCUMENTS

| 5,530,267 A | 6/1996 | Brandle, Jr. et al. | |
|---|---|---|---|
| 6,057,561 A | 5/2000 | Kawasaki et al. | |
| 6,156,581 A | * 12/2000 | Vaudo et al. | ................. 438/22 |

FOREIGN PATENT DOCUMENTS

| EP | 0 863 555 | 9/1998 |
|---|---|---|
| JP | 08-288220 | 11/1996 |
| JP | 8-288220 | 11/1996 |
| JP | 10-256673 | 9/1998 |
| JP | 10-270749 | 10/1998 |

OTHER PUBLICATIONS

N. Kimizuka, et al., Journal of Solid State Chemistry, vol. 78, pp. 98–107, "Structural classification of RAO$_3$(MO)$_n$ Compounds (R = Sc, In, Y, OR Lanthanides; A = Fe(III), Ga, Cr, OR Al; M = Divalent Cation; n = 1–11)", 1989.

N. Kimizuka, et al., Journal of Solid State Chemistry, vol. 74, pp. 98–109, "Homologous Compounds, InFeO$_3$(ZnO)$_m$(m= 1–9)", 1988.

J. Koike, et al., Jpn. J. Appl. Phys., vol. 34, No. 5B, pp. 2678–2682, "Quasi–Microwave Band Longitudinally Coupled Surface Acoustic Wave Resonator Filters Using ZnO/Sapphire Substrate", 1995.

A. Ohtomo, et al., Applied Physics Letters, vol. 75, No. 17, pp. 2635–2637, "Single Crystalline ZnO Films Grown On Lattice–Matched ScAlMgO$_4$(0001)", Oct. 25, 1999.

C.D. Brandle, et al., Solid–State Electronics, vol. 41, No. 12, pp. 1943–1945, "Stability of Hydrogen In ScAlMgO$_4$", 1997.

E. S. Hellman, et al., 3 pages, "ScAlMgO$_4$: An Oxide Substrate For GaN Epitaxy" MRS Internet Journal of Nitride Semiconductor Research, vol. 1, Article 1, "ScAlMgO$_4$: An Oxide Substrate For GaN Epitaxy", Jan. 16, 1996.

PCT International Preliminary Examination Report for Interntional Application No. PCT/JP00/01736. (6 Pages).

(Continued)

*Primary Examiner*—Shouxiang Hu
(74) *Attorney, Agent, or Firm*—Neifeld IP Law, PC

(57) ABSTRACT

The present invention provides a high quality thin film comparable to a bulk single crystal and providres a semiconductor device with superior characteristics. A channel layer 11, for example, is formed of a semiconductor such as zinc oxide ZnO or the like. A source 12, a drain 13, a gate 14 and a gate insulating layer 15 are formed on the channel layer 111 to form an FET. For a substrate 16, a proper material is selected depending on a thin film material of the channel layer 11 in consideration of compatibility of both lattice constants. For example, if ZnO is used for the semiconductor of the channel layer as a base material, ScAlMgO$_4$ or the like can be used for the substrate 16.

13 Claims, 15 Drawing Sheets

(A)

OTHER PUBLICATIONS

Kawasaki et al., "Fabrication of Alloys and Superlattices Based on ZnO Towards Ultraviolet Laser", Material Science and Engineering, B65 (1998), pp. 263–266.

Koike et al., "Quasi–Microwave Band Longitudinally Coupled Surface Acoustic Wave Resonator Filters Using ZnO/Sapphire Substrate", Jpn. J. Appl. Phys. vol. 34, (1995), pp. 2678–2682.

* cited by examiner (A)

(B)

| THIN FILM MATERIAL | LATTICE CONSTANT (Å) |
|---|---|
| ZnO | 3.249 |
| AlN | 3.112 |
| GaN | 3.189 |
| InN | 5.76 |

FIG. 2

| SUBSTRATE MATERIAL | LATTICE CONSTANT(Å) |
|---|---|
| $ScAlMgO_4$ | 3.236 |
| $ScAlZnO_4$ | 3.242 |
| $ScAlCoO_4$ | 3.247 |
| $ScAlMnO_4$ | 3.260 |
| $ScGaZnO_4$ | 3.259 |
| $ScGaMgO_4$ | 3.272 |

SEMICONDUCTOR DEVICE

TECHNICAL FIELD

The present invention relates to a semiconductor device. More particularly, the invention relates to a semiconductor device having a high quality single crystal thin film formed by using group II oxide or group III nitride as a thin film material, and an oxide single crystal having good lattice compatibility with the thin film material for a substrate. The invention also relates to the application of such a semiconductor device to a light emission device, a surface acoustic wave (SAW) device, or the like.

BACKGROUND ART

Heretofore, in the semiconductor device, for example, as a transistor, a thin film transistor using amorphous silicon, polycrystal silicon or the like has been utilized. Recently, focus of attention has been placed on zinc oxide (ZnO) to be used as a thin film material for manufacturing the semiconductor device. Not only an ultraviolet ray emission device, a transparent transistor, and so on, have replaced the existing application as photo-electron devices, but also totally new applications have been developed. Currently, for manufacturing a light emission device or a transistor using ZnO, a sapphire substrate is used.

In addition, heretofore, for manufacturing the semiconductor device, the formation of a high quality thin film on the substrate has been much requested. The following factors may conceivably determine the quality of thin film crystallinity (coherency):

(a) grain size;
(b) fluctuation of lattice plane spacing (distortion; and
(c) fluctuation of lattice plane direction orientation, mosaicness).

Generally, a high quality crystal is characterized by (a) a large grain size, (b) small fluctuation of lattice plane spacing, and (c) small mosaicness.

DISCLOSURE OF THE INVENTION

However, in the conventional substrate using sapphire or the like, lattice mismatching with ZnO as a thin film material was large, reaching ap roximately 18%. Consequently, a grain boundary existed or mosaicness was increased to make it difficult to form a high quality single crystal thin film. In addition, conventionally, with regard to device performance, the intrinsic performance of ZnO was not placed into full play, making it impossible to always manufaccure an optimal substrate.

The present invention was made to solve the foregoing problems. It is an object of the invention to manufacture a semiconductor device with sperior characteristics by using an oxide crystal having very high lattice compatibility with a thin film material such as group II oxide, e.g., ZnO or group III nitride, e.g., GaN, for a substrate, thereby increasing the quality of the thin film material, and then forming a high quality thin film comparable to a bulk single crystal. It is another object of the invention to form a semiconductor thin film of ZnO, GaN or the like, having almost no grain boundaries, a large grain size, small fluctuation of lattice plane spacing, very small mosaicness, and a high quality nearly comparable to a single crystal.

According to the invention, for example, since lattice mismatching of an ScAlMgO$_4$ (SCAM) crystal or the like with ZnO is small (approximately 0.13%), an object is to form a ZnO thin film of nearly a single crystal on a substrate. Another object according to the invention is to form ZnO on the SCAM substrate having higher electron mobility and more comparable to a ZnO single crystal compared with that of the conventional sapphire substrate or the like.

According to the invention, an object is to manufacture a transparent semiconductor device by combining a transparent semiconductor material of ZnO with a transparent and highly insulating SCAM substrate, and greatly improve the performance of a heterostructured device.

An object is to achieve a high switching speed by applying the invention to a transistor or the like. In addition, an object is to lower a gate voltage for switching by applying the invention to a field effect transistor so as to obtain a wider depletion layer when an electric field is applied. Another object is to increase light emission efficiency by applying the invention to a light emission device.

An object is to improve the performance of various electron devices by applying the invention to the devices including a field effect transistor, a bipolar transistor, a light emission device containing a GaN based nitride blue laser (LED, laser), a surface acoustic wave (SAW) device, a sensor or the like.

In accordance with first solving means of the invention, a semiconductor device is provided, comprising: a substrate using a material containing one selected from LnABO$_4$ and LnAO$_3$(BO)$_n$ for a basic structure (Ln: rare earth element selected from Sc, In, Lu, Yb, Tm, Ho, Er, Y or the like, A: selected from Fe, Ga and Al, and B: selected from Mn, Co, Fe, Zn, Cu, Mg and Cd); and a semiconductor layer formed on the substrate by using a material selected from the group II oxides including zinc oxide ZnO, zinc magnesium oxide Mg$_x$Zn$_{1-x}$O, zinc cadmium oxide Cd$_x$Zn$_{1-x}$O, cadmium oxide CdO, and so on, and the group III nitrides including gallium nitride GaN, aluminum nitride AlN, indium nitride InN, and so on.

Further, in accordance with the invention, a semiconductor device is provided, which is applied to a photo-electronic device such as a light emission device, a SAW device or the like.

BRIEF DESCRIPTION OF THE DRAWINGS

FIG. 2 is a view showing an example of a representative thin film material used for a channel layer, and a lattice constant thereof.

FIG. 4 is a view showing an example of a substrate material using LnABO$_4$ for a basic structure, and a lattice constant thereof.

BEST MODES OF CARRYING OUT THE INVENTION

(1) Field Effect Transistor (FET)

Figure 1:
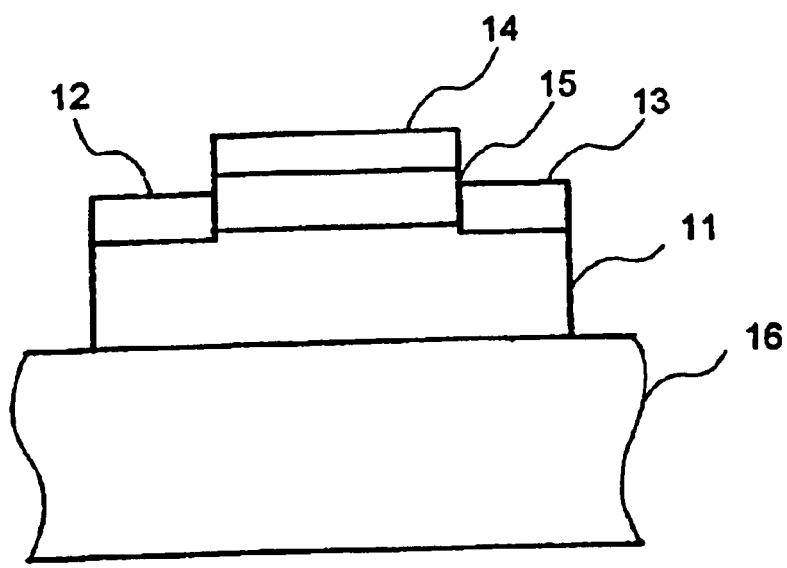
FIGS. 1A and 1B are sectional views, each of which shows a semiconductor device according to a first embodiment of the present invention.
Figure 1:
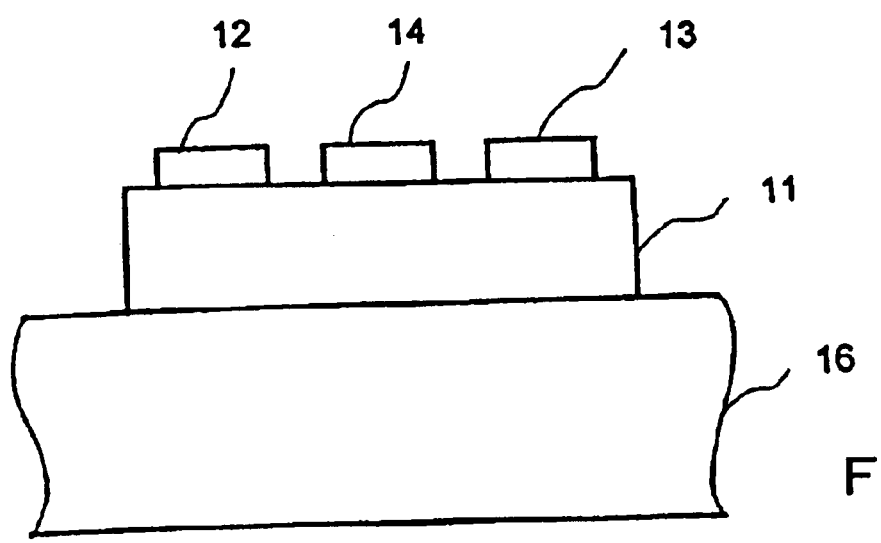

FIGS. 1A and 1B are sectional views, each of which shows a semiconductor device according to the first embodiment of the invention. As shown in FIG. 1A, the semiconductor device of the first embodiment is for an FET, and comprises: a channel layer (semiconductor layer) 11; a source 12; a drain 13; a gate 14; a gate insulating layer 15; and a substrate 16. The channel layer 11 is formed on the substrate 16. On the channel layer 11, the gate insulating layer 15, the source 12, and the drain 13 are formed. The gate 14 is formed on the gate insulating layer 15.

FIG. 1B specifically shows a modified example of the first embodiment. This transistor includes the channel layer 11 formed on the substrate 16. Further, on the channel layer 11, the source 12 and the drain 13 are formed by ohmic junction, and the gate 14 is formed by Schottky junction. In this example, since the gate insulating layer 15 does not exist unlike the case shown in FIG. 1A, proper spacing is set between the source 12/drain 13 and the gate 14.

Next, description will be made of materials for components, which are the main features of the invention.

First, the channel layer 11 is formed of a proper conductive or insulating semiconductor based on an FET structure. As a material to be used for the channel layer 11, other than a widely known semiconductor material, one can be selected from group II oxides including, e.g., zinc oxide ZnO, zinc magnesium oxide $Mg_xZn_{1-x}O$, zinc cadmium oxide $Cd_xZn_{1-x}O$, cadmium oxide CdO, and so on. For the channel layer 11, one selected from group III nitrides including gallium nitride GaN, aluminum nitride AlN, indium nitride InN, InGaN, AlInN, and so on, can be used. For the channel layer 11, an undoped and pure or nearly pure thin film material is used. For the channel layer 11, one made of a doped material may also be used. In addition, these thin film materials maybe n or p type.

FIG. 2 shows an example of a representative thin film material used for the channel layer, and the lattice constant thereof. The description will be maue by way of example of materials shown. But there should be no limitation placed in this regard.

An insulating material is used for the substrate 16. In the invention, a high quality channel layer 11 was formed by using a highly compatible material to have a lattice constant approximated to the lattice constant of the channel layer 11. For example, if ZnO is used for the channel layer 11, by using one of the highest performance materials, e.g., a zinc oxide single crystal or an $ScAlMgO_4$ single crystal, for the substrate 16, the channel layer 11, the source 12, the drain 13, and so on, can be formed on the substrate by means of epitaxial growth.

Next, description will be made of a combination example of a material for the substrate 16 having high compatibility (i.e., having a lattice constant approximated to that of a thin film material) with the lattice constant of the thin film material used for the channel layer 11.

First, a case where a thin film material for the channel layer 11 is the group II oxide such as ZnO or the like will be described. For example, in the case of ZnO, one can be selected from substrate materials described below.

First, for the substrate 16, for example, a material containing $LnABO_4$ for a basic structure (crystal group 5 having a composition of $LnABO_4$, and a structure of $YbFe_2O_4$) like that described below can be used. That is, $LnABO_4$ Here, Ln: rare earth element of Sc, In, Lu, Yb, Tm, Ho, Er, Y or the like A: Fe, Ga or Al B: Mn, Co, Fe, Zn, Cu, Mg or Cd The lattice constant of such a substrate material is set in the range of about 3.2 to 3.5 Å. A material for such a basic structure is, e.g., $ScAlMgO_4$ or the like.

Figure 3:
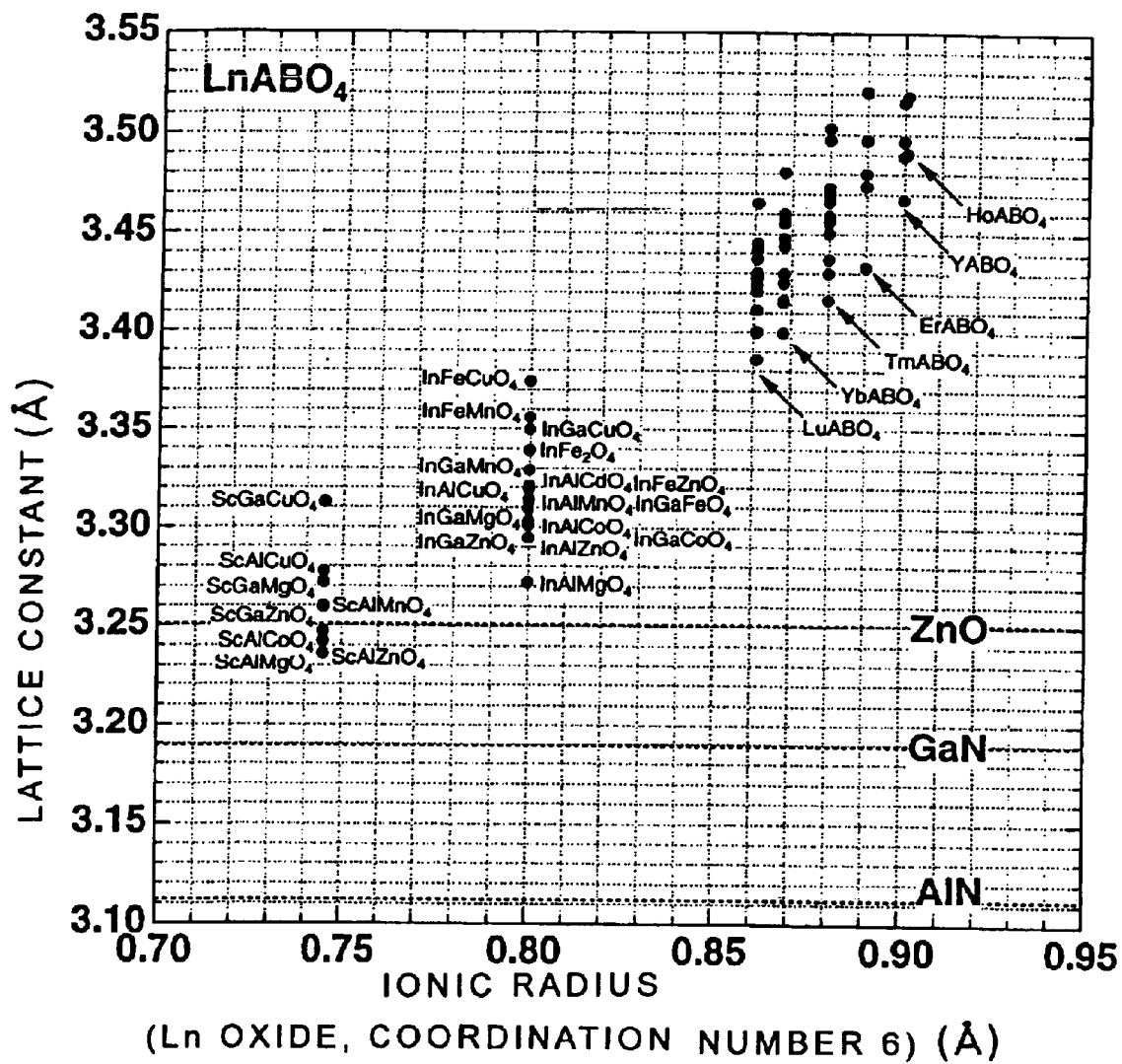
FIG. 3 is a view showing a relation between a lattice constant and an ionic radius regarding LnABO$_4$.

FIG. 3 shows a relation between a lattice constant and an ionic radius regarding $LnABO_4$. An abscissa indicates an ionic radius of an Ln oxide having a coordination number of 6, while an ordinate indicates a lattice constant. As shown, by analyzing the lattice constant, it can be understood that as an ionic radius (atom size) of an Ln element is larger, a lattice constant of $LnABO_4$ is increased. In addition, the lattice constants of ZnO, GaN and AlN are indicated by a horizontal line (broken line), and an oxide containing $LnABO_4$ near such a lattice constant for a basic structure is shown.

Figure 6:
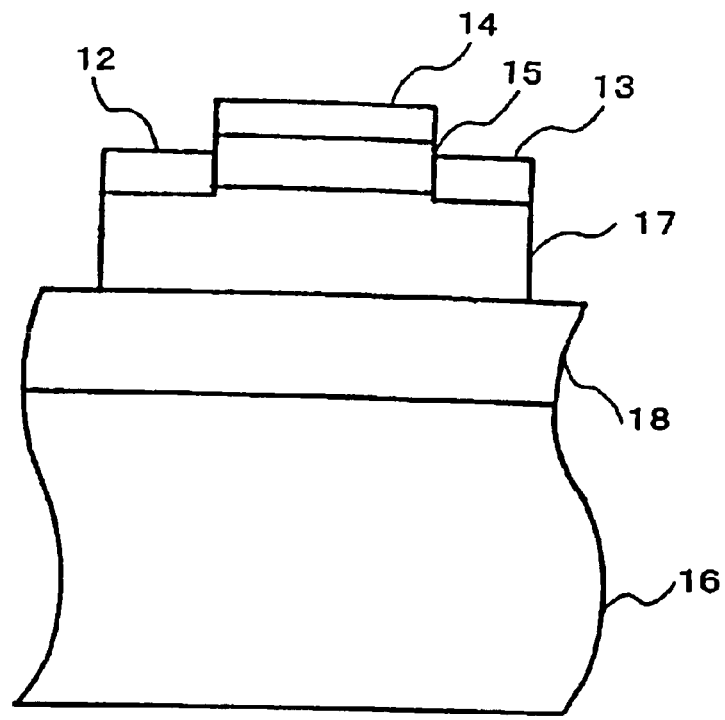
FIGS. 6A and 6B are sectional views, each of which shows a semiconductor device according to a second embodiment of the invention.
Figure 6:
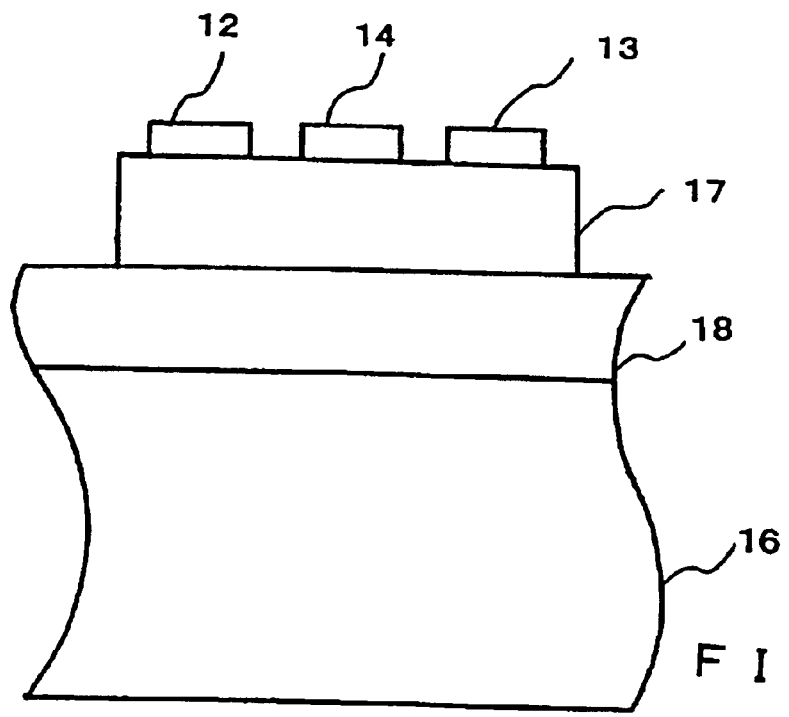

FIG. 4 shows an example of a substrate material containing $LnABO_4$ for a basic structure, and the lattice constant thereof. As exemplary materials having relatively small lattice constants, $ScAlMgO_4$, $ScAlZnO_4$, $ScAlCoO_4$, $ScAlMnO_4$, $ScGaZnO_4$, and $ScGaMgO_4$ are shown. Since the lattice constant of ZnO is 3.249 Å as shown in FIG. 2, if any one of the substrate materials shown in FIG. 6 is used, compatibility of the lattide constants can be improved. As substrate materials having high compatibility, $ScAlCuO_4$, $InAlMgO_4$, and so on, shown in FIG. 3 are available, and there should be no limitation in this regard.

Further, for the, substrate 16, in order to realize matching with ZnO, a ZnO added oxide material like that described below can also be used. To use a general formula, a material (crystal group having a composition of $LnAO_3(BO)_n$, and a structure of $Yb_2Fe_3O_7$) containing $LnAO_3(BO)_n$ described below for a basic structure can be used as occasion demands. That is, $LnAO_3(BO)_n$ Here, Ln: rare earth element selected from Sc, In, Lu, Yb, Tm, Ho, Er, Y, and so on A: Fe, Ga or Al B: Mn, Co, Fe, Zn, Cu, Mg or Cd Thus, if ZnO is mixed in the $LnABO_4$ structure, the ZnO enters a lattice space, thus making it possible to synthesize a material approximated to the lattice constant of ZnO. If n is infinitely increased, the lattice constant endlessly approaches 3.249 (lattice constant of ZnO).

Figure 5:
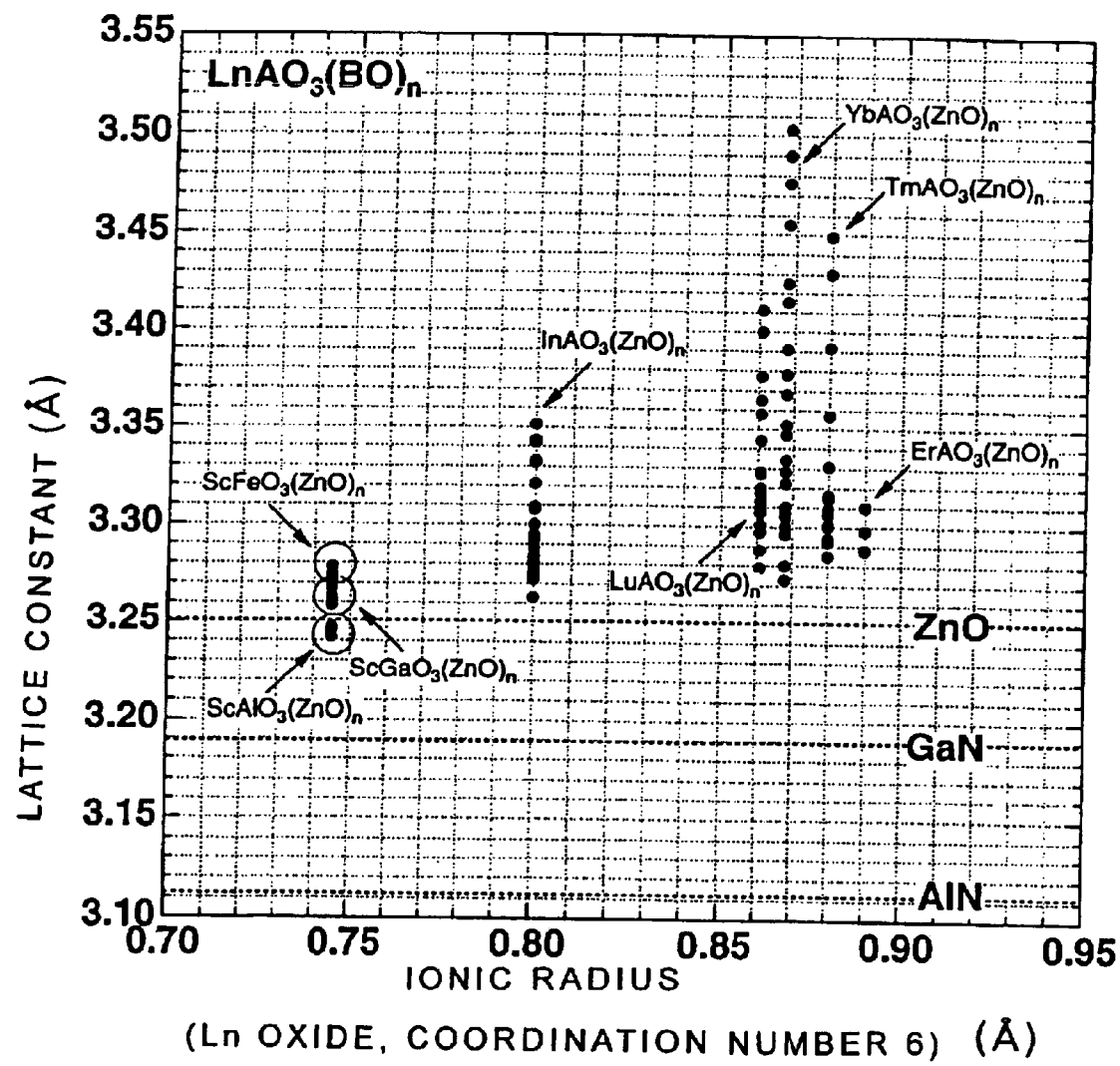
FIG. 5 is a view showing a relation between a lattice constant and an ionic radius regarding LnAO$_3$(BO)$_n$.

FIG. 5 shows a relation between a lattice constant and an ionic radius regarding $LnAO_3(BO)_n$. An abscissa indicates an ionic radius of an Ln oxide having a coordination number of 6, while an ordinate indicates a lattice constant. As in the case shown in FIG. 3, the analysis of the lattice constant shows that as an ionic radius (atom size) of an Ln element is larger, a lattice constant of $LnAO_3(BO)_n$ is increased. The lattice constants of ZnO, GaN and AlN are indicated by a horizontal line (broken line), and an oxide containing $LnAO_3(BO)_n$ near such a lattice constant for a basic structure is shown.

As shown, specifically, lattice compatibility is improved by using, e.g., one of the followings:

$ScAlO_3(ZnO)_n$ $ScFeO_3(ZnO)_n$ $ScGaO_3(ZnO)_n$ $InFeO_3(ZnO)_n$ $InGaO_3(ZnO)_n$ $InAlO_3(ZnO)_n$ $YbAlO_3(ZnO)_n$ $LuAlO_3(ZnO)_n$

Further, among the above, a material can be selected from, e.g., the group consisting of $ScAlZn_3O_6$, $ScAlZn_4O_7$ and $ScAlZn_7O_{10}$, the group consisting of $ScGaZn_3O_6$, $ScGaZn_5O_8$ and $ScGaZn_7O_{10}$, the group consisting of $ScFeZn_2O_5$, $ScFeZn_3O_6$ and $ScFeZn_6O_9$, or the like.

Secondly, a case where a thin film material for the channel layer 11 is the group III nitride such as GaN, AlN or the like will be described. For example, as shown in FIG. 2, the lattice constants of GaN and AlN are respectively 3.112 Å and 3.189 Å. An oxide crystal taking the $LnABO_4$ structure shown in FIGS. 3 and 4 has a lattice constant of about 3.2 Å at a minimum. Thus, a crystal which can match the lattice constants of GaN and AlN may be selected from, among others, e.g., $ScAlMgO_4$, $ScAlZnO_4$, and so on, having smallest lattice constants.

Other than the materials shown in FIGS. 3 to 5, the followings can be cited as materials having relatively small lattice constants and high compatibility with GaN, AlN or the like:

$ScAlBeO_4$ $ScBMgO_4$ $ScBBeO_4$

In the above general formula $LnAO_3(BO)_n$, a material selecting Mg as B has high compatibility. In other words, this substrate is one obtained by adding MgO to one of the foregoing oxide substrate materials.

A proper insulating material is used for the gale insulating layer 15. For the gate insulating layer 15, a highly insulating material having high lattice compatibility with the material of the channel layer 11. As described above, similar to the case where the material having high lattice constant compatibility was used for the substrate 16 according to the thin film material of the channel layer 11, a proper insulting layer having high lattice compatibility can be selected. For example, if ZnO is used for the channel layer 11, then, e.g., $ScAlMgO_4$ or the like can be used for the gate insulating layer 15. In addition, for the gate insulating layer 15, a transparent insulating material such as insulating ZnO doped with, e.g., an element capable of taking valence of 1 value or a group V element can also be used. As the element taking valence of 1 value, e.g., group I elements (Li, Na, K, Rb and Cs), Cu, Ag, Au, and so on, are available. As the group V element, N, P, As, Sb, Bi, and so on, are available. For both layers, lattice constants within all the surfaces coincide with one another at 1% or lower. Accordingly, mutual epitaxial growth is possible, thereby realizing a semiconductor device having superior lattice compatibility.

In addition, by using a ferroelectric. material for the gate insulating layer 15, the transistor itself can be provided with a memory function. As ferroelectric materials, e.g., $Zn_{1-x}Li_xO$, $Zn_{1-x}(Li_yMg_{x-y})O$, and so on, are available. For the gate insulating layer 15, e.g., an insulator such as glass, vinyl, plastic or the like may be used. Other than these, for the gate insulating layer 15, an insulating oxide such as $Al_2O_3$, MgO, $CeO_2$, $SiO_2$ or the like can be used.

The gate insulating layer 15 has been described. For forming other proper insulating layers, the same materials can be used. Thus, it is possible to manufacture a semiconductor device having high lattice compatibility.

For the source 12, the drain 13 or the gate 14, a proper electrode material can be used. As such an electrode material, a conductive material doped/undoped with impurities as occasion demands, using the same material as that for the channel layer 11 as a base, can be used. As an electrode containing ZnO or the like as a base, conductive ZnO or the like is used, which is doped with, e.g., oneselected from group III elements (B, Al, Ga, In, and Tl), group VII elements (F, Cl, Br, and I), group I elements (Li, Na, K, Rb and Cs) and group V elements (N, P, As, Sb and Bi), or undoped with any of such various elements. Here, in the case of doping such an element, the amount of doping can be set as occasion demands (e.g., $n^{++}$-ZnO or the like doped with high concentration n type can be used, but there should be no limitation in this regard). By using as a base such a material having the same structure/composition as that for the channel layer 11 or the like, it is possible to manufacture a semiconductor device having high lattice constant compatibility and high quality. Moreover, other than the above materials, metal such as Al, Cu or the like, or highly doped semiconductor polysilicon or the like can be used. Other materials can also be used for the source 12, the drain 13 or the gate 14, e.g., $In_2O_3$, $SnO_2$, $(In-Sn)O_x$, and so on.

(2) FET Equipped with Substrate Having Buffer Layer

FIGS. 6A and 6B are sectional views, each of which shows a semiconductor device according to the second embodiment of the invention. As shown in FIG. 6A, the semiconductor device of the second embodiment is for an FET, and comprises: a source 12; a drain 13; a gate 14; a gate insulating layer 15; a channel layer 17; a buffer layer 18; and a substrate 16.

If the channel layer 11 is in an undoped pure state, or slightly doped with impurities, a constitution like that shown in FIG. 1A is employed to realizing good compatibility between the lattice constants of the substrate 16 and the channel layer 11. On the other hand, according to the second embodiment, with regard to a case where a material doped with a considerable amount of impurities (e.g., about 10 to 20%) is used for the channel layer 17, or the like, the compatibility between the lattice constants can be further improved. Here, for such a purpose, the buffer layer 18 is provided between the substrate 16 and the channel layer 17.

For the channel layer 17, a material having a composition similar to that of the first embodiment. However, in the second embodiment, one doped with relatively large amount of impurities can be used. For the substrate 16, similarly to the case of the first embodiment, a material having high compatibility is used properly according to the channel layer 17. For the buffer layer 18, if group II oxide or group III nitride is used for the channel layer 17, then a slightly doped or unduped insulating material having the same composition as that of the channel layer 17 can be used. For example, if e.g., ZnO is used for the channel layer 17, for the buffer layer 18, an insulating material such as insulating ZnO or the like slightly doped with an element capable of taking valence of 1 value or a group V element, or an insulating semiconductor such as undoped pure insulating ZnO or the like, can be used. As the element taking valence of 1 value, e.g., group I elements (Li, Na, K, Rb, and Cs), Cu, Ag, Au, and so on, are available. As the group V element, N, P, As, Sb, Bi, and so on, are available. In the second embodiment, as in the case described above with reference to the first embodiment, the combination of each materials for the channel layer 17, for the buffer layer 18 with the same materials in composition as the thin film material of the channel layer 17, and for the substrate 16 can be properly selected by considering the compatibility of the lattice constants.

(3) Characteristic of Semiconductor Device

Next, description will be made of a suitable example of the invention, by making comparison in characteristics between the ZnO thin film formed on the ScAlMgO$_4$ substrate of the first embodiment and the ZnO thin film formed on the conventional sapphire substrate. In this example, the ZnO film was formed by using laser molecular beam epitaxy or pulse laser deposition at a substrate temperature of 300 to 1000° C.

Figure 7:
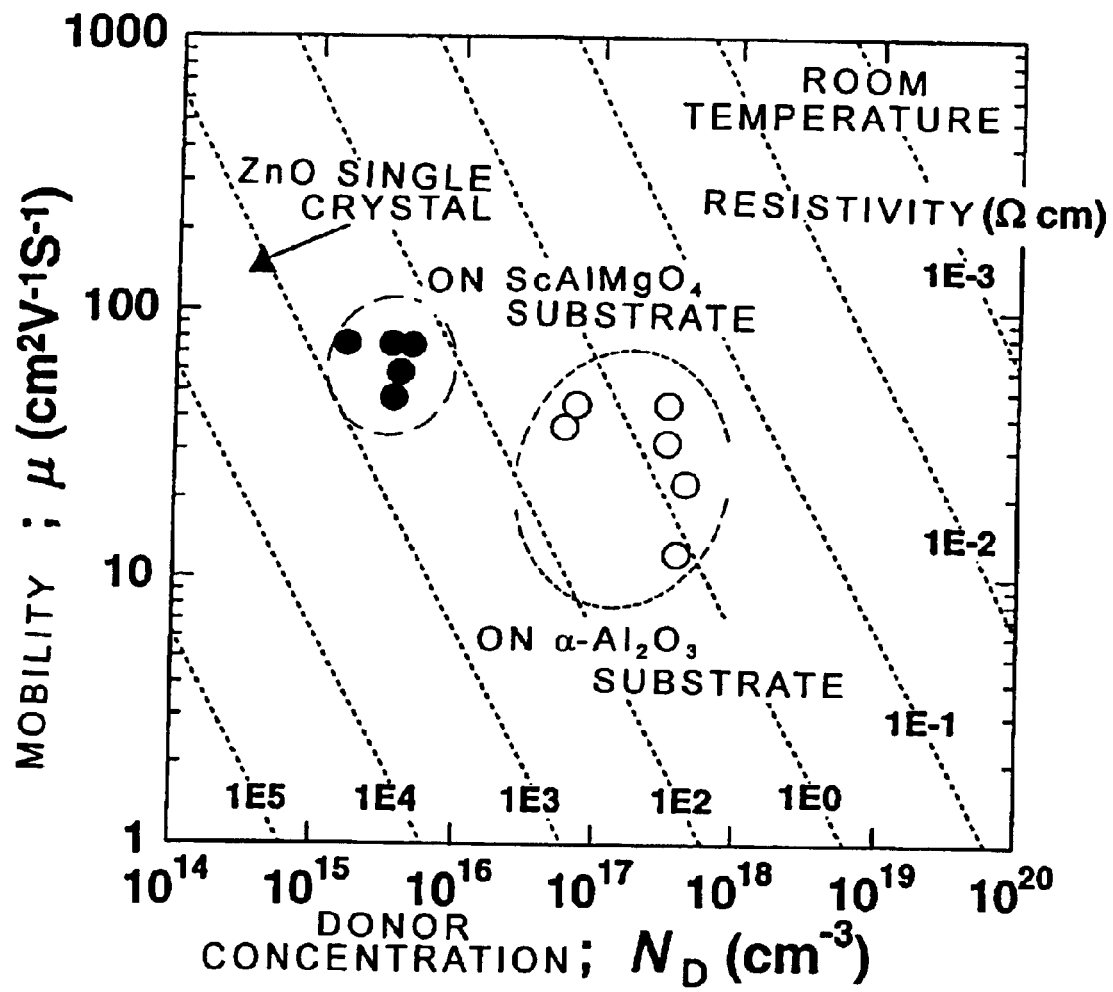
FIG. 7 is a view illustrating comparison in electric characteristics between azinc oxide thin film and a zinc oxide bulk single crystal.

FIG. 7 illustrates in comparison electric characteristics of a zinc oxide thin film and a zinc oxide bulk single crystal. FIG. 7 specifically shows the comparison of electric characteristics between a case where zinc oxide thin films are respectively formed on the ScAlMgO$_4$ substrate and the sapphire substrate ($\alpha$-Al$_2$O$_3$ substrate) and a case where a zinc oxide bulk single crystal is prepared by hydrothermal synthesis. As an electric characteristic, a relation between mobility $\mu$ and donor concentration N$_D$ indicating electron or carrier concentration at a room temperature is shown. A relation between resistivity $\sigma$ and mobility $\mu$/donor concentration N$_D$ is as follows:

$$\sigma = 1/(e\mu N_D)$$

Here, e represents an elementary charge quantity.

The characteristic of a bulk single crystal is shown to indicate the original physical property of ZnO. The bulk ZnO single crystal has high mobility, low donor concentration and a good characteristic. One of the objects of invention is to obtain a characteristic as close as possible to such a bulk single crystal characteristic. On the other hand, if the ZnO film is formed on the conventional sapphire substrate, mobility is low, and donor concentration is high. In the case of the ZnO film formed on the ScAlMgO$_4$ substrate of the invention, however, compared with the conventional case, mobility is high, and donor concentration is low, thus making it possible to obtain a good characteristic approximated to that of the ZnO bulk single crystal. Further, as shown, the concentration of donor to be mixed in is low from the beginning according to the invention. Thus, by adjusting the amount of donor or acceptor to be added, a control range/setting range can be set large for donor concentration or acceptor concentration. According to the invention, it is possible to form a thin film having carrier concentration of about 10$^{15}$ cm$^{-3}$ and electron mobility of about 60 to 70 cm$^2$/Vs with good reproducibility. Such a difference in characteristic may be attributed to defects, impurities, grain boundaries or the like.

As apparent from FIG. 7, a high switching speed can be achieved by applying the invention to a transistor or the like. Moreover, since the application of the invention to the FET or the like results in a wider depletion layer when an electric field is applied, a gate voltage for switching can be low. By applying the invention to the light emission device, it is possible to increase light emission efficiency.

Figure 8:
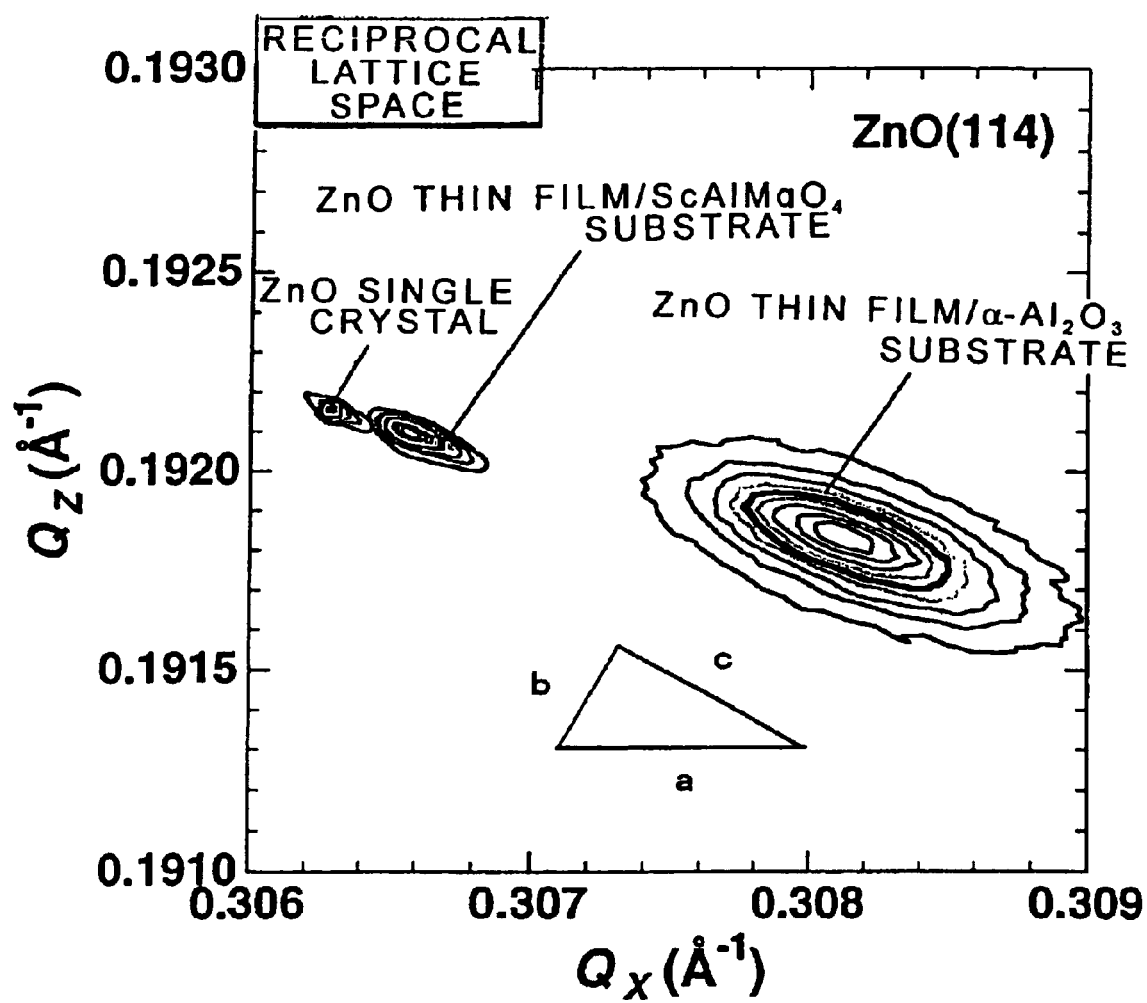
FIG. 8 is a view illustrating comparison in X-ray reciprocal lattice mapping between the zinc oxide thin film and the zinc oxide bulk single crystal.

FIG. 8 illustrates in comparison X-ray reciprocal lattice mapping between the zinc oxide thin film and the zinc oxide bulk single crystal. FIG. 8 specifically shows the comparison of X-ray reciprocal lattice mapping between a case where ZnO thin films are formed respectively on the ScAlMgO$_4$ substrate and the sapphire substrate, and a case where a ZnO thin film having a zinc oxide bulk single crystal formed by hydrothermal synthesis is formed. In the drawing, a reciprocal lattice space between the reciprocal number Qz (ordinate) of the lattice constant of a z direction and a reciprocal number Qx (abscissa) of the lattice constant of an x direction is also shown. In shown arrow directions, (a) a reciprocal number of grain size, (b) fluctuation of lattice plane spacing, and (c) fluctuation of lattice plane direction (mosaicness) are respectively shown. Here, the characteristic of ZnO (114) is shown as an example of asymmetrical diffraction surfaces. Similar results can be obtained for each diffraction surfaces (115), (104) and (105).

As shown, according to the invention, compared with the conventional case, the followings are apparent, i.e., (a) a grain size is larger, (b) fluctuation of lattice plane space is smaller, and (c) fluctuation of a latLice plane direction is smaller (mosaicness). In addition, according to the invention, compared with the conventional case, crystallinity can be improved drastically, and a single crystal ZnO thin film similar in mosaicness, a grain size, and so on, to the bulk single crystal, can be obtained. Apparently from the drawing, according to the invention, the lattice constant has been approximated to that of a bulk crystal, and diffraction peak has become sharp.

Figure 9:
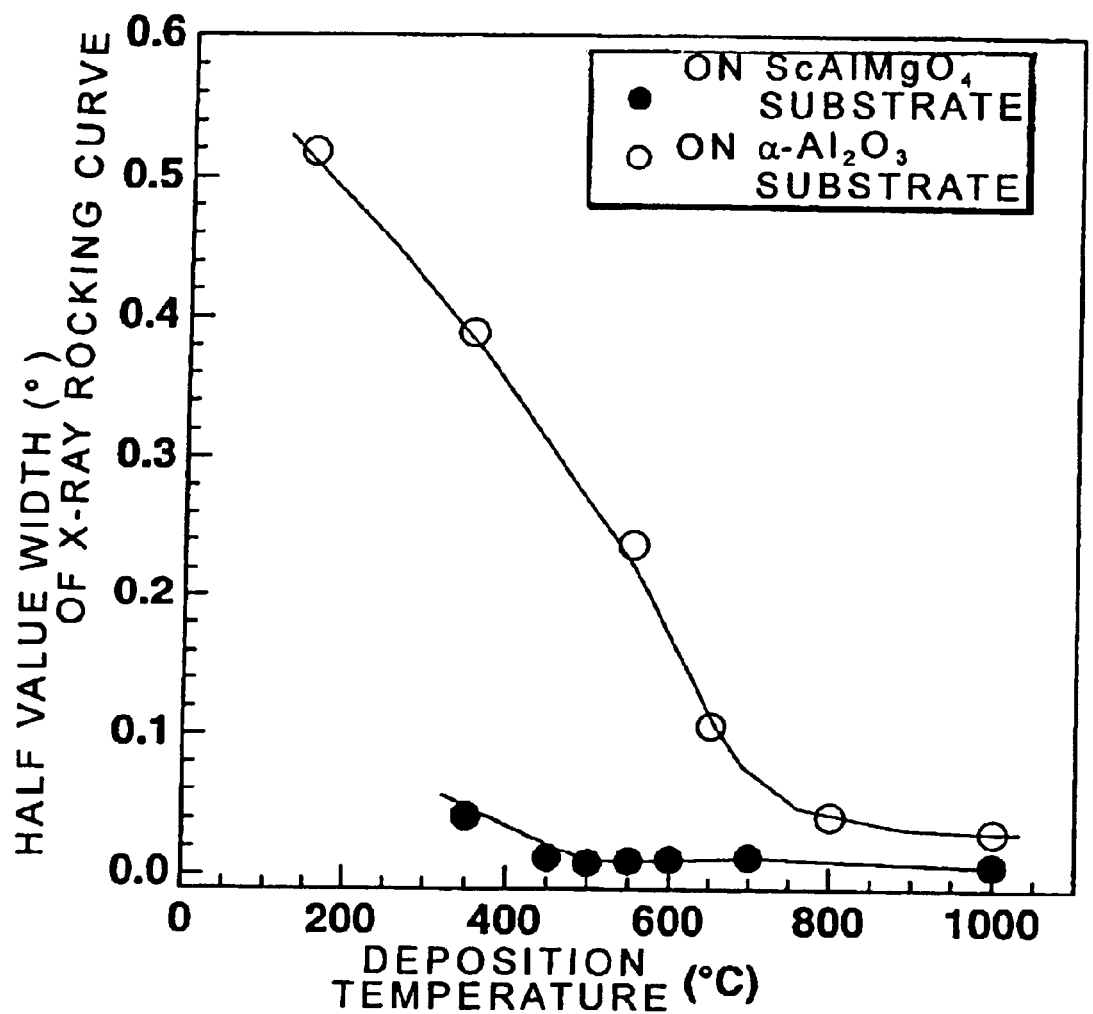
FIG. 9 is a comparative view illustrating dependence of a half value width of an X-ray rocking curve on a substrate temperature.

FIG. 9 is a comparative view illustrating the dependence of the half value width of an X-ray rocking curve on a substrate temperature. In the drawing, a relation between a half value width and a deposition temperature regarding the ZnO films on the ScAlMgO$_4$ substrate and the sapphire substrate.

Generally, the half value width of an X-ray rocking curve indicates the fluctuation of a lattice plane direction (mosaicness) and a gain size. Specifically, according to the invention, since the half value width of the X-ray rocking curve is smaller compared with that of the conventional case, the ZnO films have superior characteristics. For example, if the ScAlMgO$_4$ substrate is used as in the case of the invention, even for a ZnO thin film formed at a low deposition temperature of about 300° C., mosaicness and a grain size similar to those of the thin film deposited on the conventional sapphire substrate at 1000° C. are obtained, thus making it possible to obtain a thin film having very high crystallinity. Generally, interlayer diffusion may occur if a thin film is formed at a high temperature. According to the invention, however, such interlayer diffusion can be reduced or even prevented.

Figure 10:
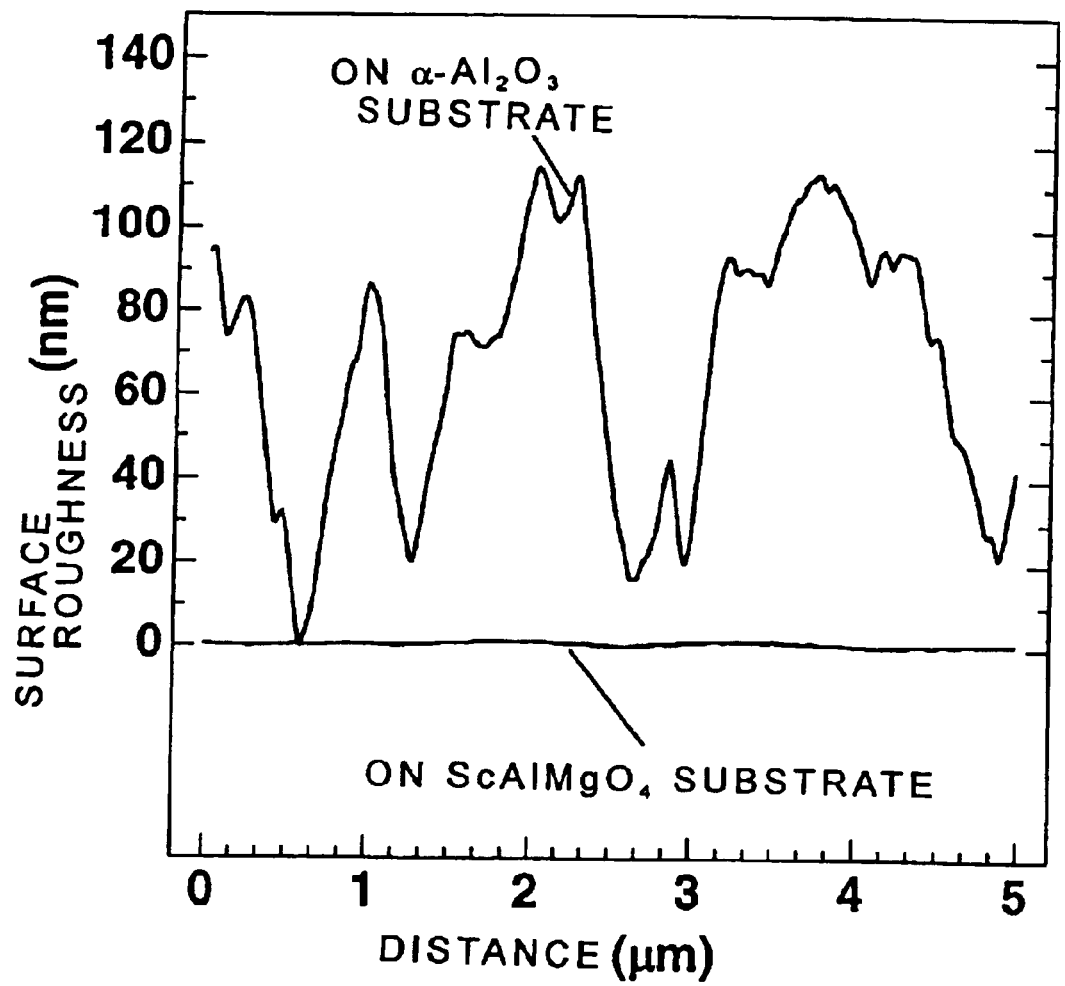
FIG. 10 is a comparative view illustrating flatness of a thin film surface.

FIG. 10 is a comparative view illustrating the flatness of a thin film surface. As apparent from the drawing, the ZnO thin film surface on the ScAlMgO$_4$ of the invention has concave and convex portions greatly reduced (e.g., about ¹⁄₁₀₀ by precise measurement) compared with those on the ZnO thin film surface on the conventional sapphire substrate. According to the invention, the ZnO thin film surface can be formed flat atomically by the step of 0.26 nm (½ of c axis length) or 0.52 nm (c axis length).

Figure 11:
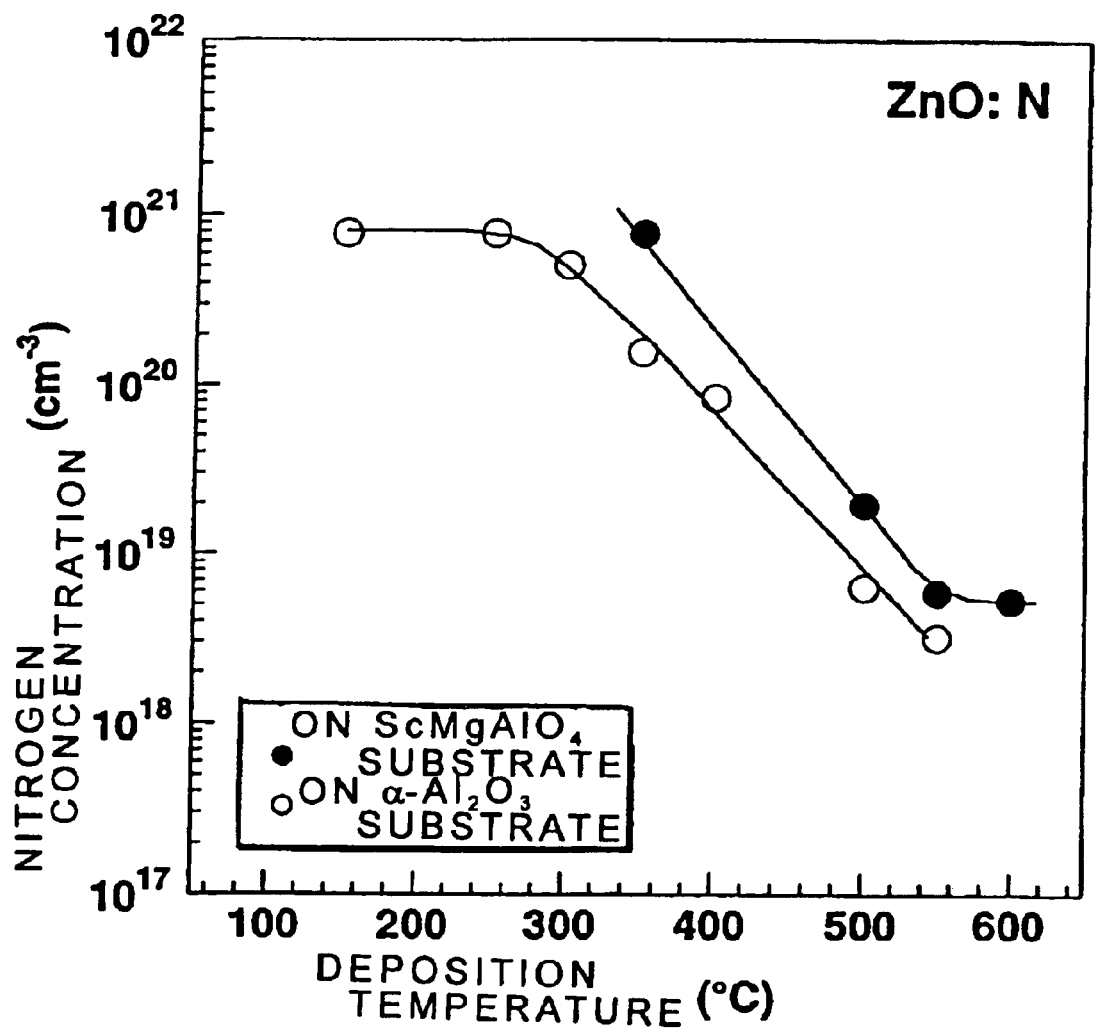
FIG. 11 is a comparative view illustrating dependence of nitrogen concentration on the substrate temperature.

FIG. 11 is a comparative view illustrating the dependence of nitrogen concentration on a substrate temperature. FIG. 11 specifically shows a relation between nitrogen concentration and a deposition temperature regarding a case where ZnO thin films doped with nitrogen are formed on the ScAlMgO$_4$ substrate of the invention and the conventional sapphire substrate. According to the invention, compared with the conventional case, the amount of nitrogen doping can be almost doubled (in other words, nitrogen doping is easier). This means that to obtain the amount of doping similar to that of the conventional case, a ZnO thin film can be formed at a low deposition temperature of about 50° C., in other words, a doping characteristic can be improved. The nitrogen doping characteristic is equivalent to the acceptor characteristic of the device.

(3') Other FET

Figure 12:
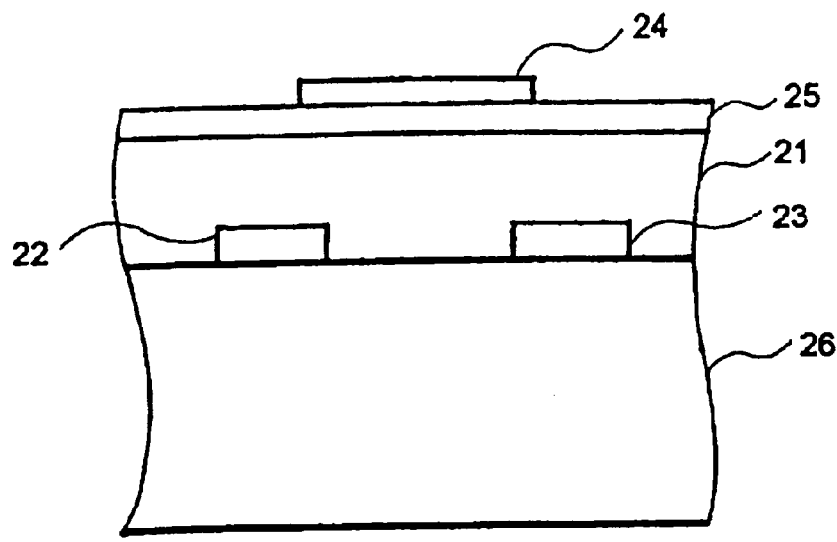
FIGS. 12A and 12B are sectional views, each of which shows a semiconductor device according to a third embodiment of the invention.
Figure 12:
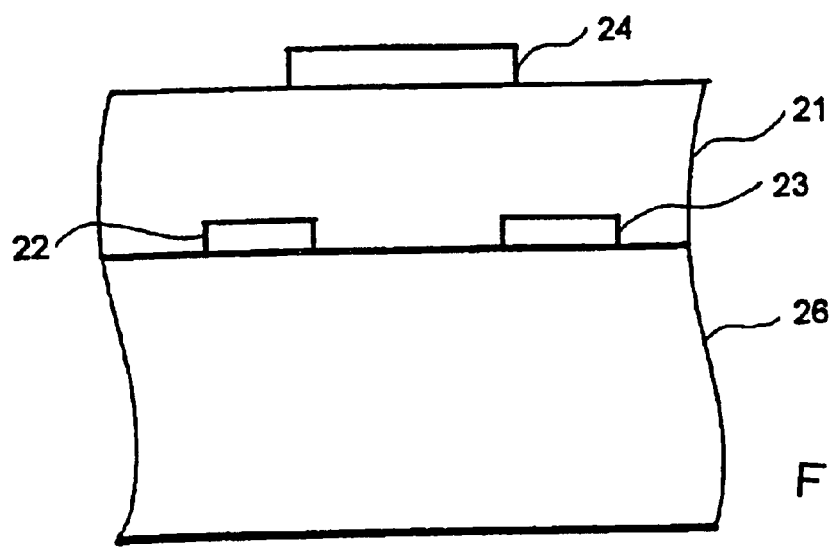

FIGS. 12A and 12B are sectional views, each of which shows a semiconductor device according to the third embodiment of the invention. The semiconductor device of the third embodiment shown in FIG. 12A is for an FET, and comprises: a channel layer 21; a source 22; a drain 23; a gate 24; a gate insulating layer 25; and a substrate 26. The source 22 and the drain 23 are formed on the substrate 26. The channel layer 21 is formed to cover these components. Further, the gate insulating layer 25 is formed on the channel layer 21. The gate 24 is formed on the gate insulating layer 25. The gate 24, the gate insulating layer 25 and the channel layer 21 make MIS structure.

FIG. 12B shows a modified example of the third embodiment. Different from the one shown in FIG. 12A, the gate insulating layer 25 is not formed, and the gate 24 and the channel layer 21 are coupled by Schottky junction. If the gate insulating layer 25 is formed as in the case shown in FIG. 12A, there is little limitation placed on a voltage applied to the gate. On the other hand, if the gate insulating layer 25 is not formed as in the case shown in FIG. 12B, a withstand voltage is lowered between the gate and the source, and between the gate and the drain. In this case, a manufacturing process is simple.

With such constitutions, as described above with reference to the first and second embodiments, the thin film material of the channel layer 21, the source 22 or the drain 23, and the material of the substrate 26 or the gate insulating layer 25 can be properly combined to be used so that the lattice constants of both can be matched with each other.

Figure 13:
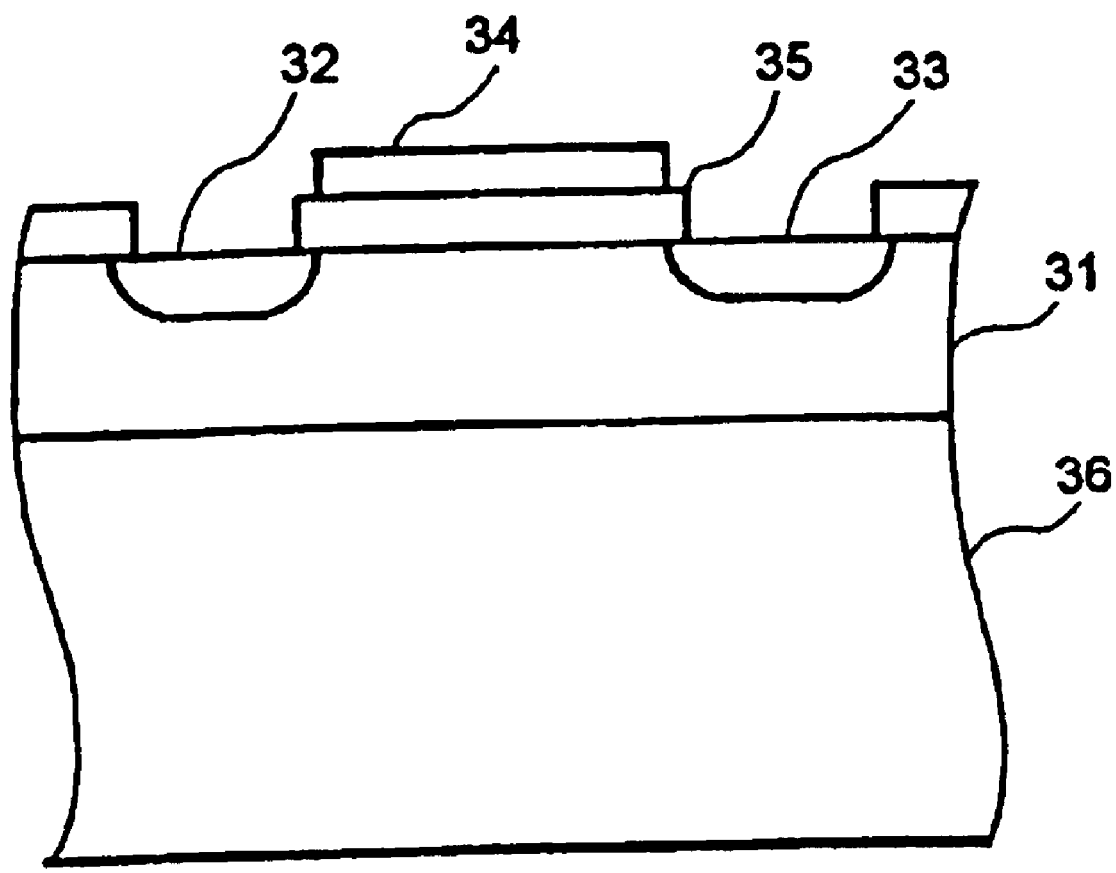
FIG. 13 is a sectional view showing a semiconductor device according to a fourth embodiment of the invention.

FIG. 13 is a sectional view showing a semiconductor device according to the fourth embodiment of the invention. The semiconductor device of the fourth embodiment is for an FET, and comprises: a channel layer 31; a source 32; a drain 33; a gate 34; a gate insulating layer 35; and a substrate 36. The channel layer 31 is formed on the substrate 36. The gate insulating layer 35 is formed on the channel layer 31, and the gate 34 is formed on the gate insulating layer 35. The source 32 and the drain 33 can be formed by, for example, diffusion, ion implantation or the like, using the gate insulating layer 35 as a mask. In addition, by properly setting the size of the gate 34 as a modified example of the described embodiment, the gate insulating layer 35 can be omitted.

Also, with such constitutions, as described above with reference to the first and second embodiments, the thin film material of the channel layer 21 and the material of the substrate 26 or the gate insulating layer 35 can be properly combined to be used so that the lattice constants can be matched with each other. Further, as described above with reference to the second embodiment, a buffer layer can be added between the channel layer 31 and the substrate 36 according to the thin film material of the channel layer 31 and the doping amount of impurities.

In the foregoing third and fourth embodiments, if not specified otherwise, materials similar to those of the first and second embodiments can be used for the respective components.

(4) Light Emission Device

Figure 14:
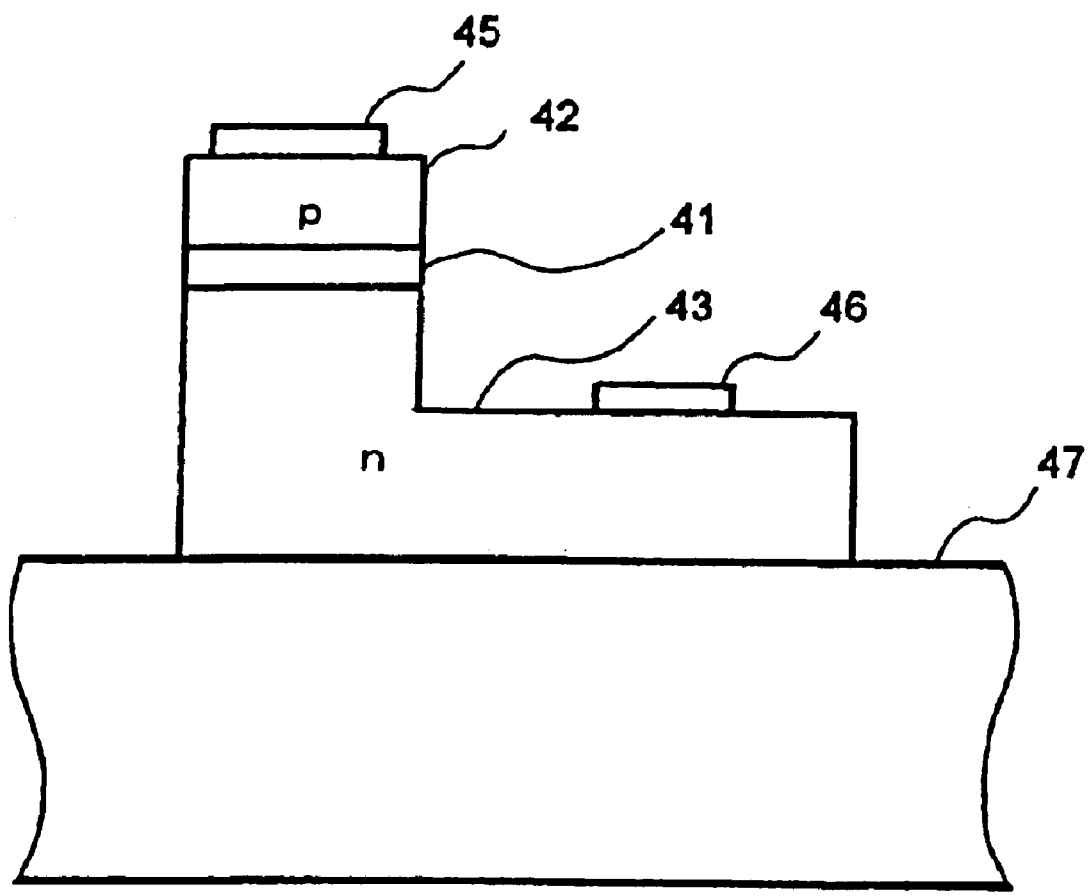
FIG. 14 is a sectional view showing a semiconductor device according to a fifth embodiment of the invention.

FIG. 14 is a sectional view showing a semiconductor device according to the fifth embodiment of the invention. The semiconductor device of the fifth embodiment is for a light emission device such as a laser diode or the like, and comprises: a light emission layer 41; a p type semiconductor layer 42; an n type semiconductor layer 43; first and second electrodes 45 and 46; and a substrate 47.

The light emission layer 41 is held between the p type semiconductor layer 42 and the n type semiconductor layer 43. This light emission layer 41 can be formed by using, e.g., undoped ZnO, or of a very thin multilayer film containing (Mg, Zn)O and ZnO. In this case, the ZnO layer is called a well layer, and the (Mg, Zn)O layer is called a barrier layer. In addition, one having a bandgap of the barrier layer set larger than that of the well layer is used. As other materials for the light emission layer 41, the multilayer structure of (Zn, Cd)O and ZnO, the. multilayer structure of (Mg, Zn)O and (Zn, Cd)O, and so on, are available. Further, for the light emission layer 41, a multilayer reflecting film, a double heterostructure, a surface emitting laser structure, and so on, can be properly employed, and combined to be used.

As base materials for the p type and n type semiconductor layers 42 and 43, materials similar to those of the first embodiment can be properly used. For the p type semiconductor layer 42, for example, one may be selected from group II oxides such as a p type ZnO or the like, and group III nitrides such as p type GaN, AlN, InGaN, AlInN or the like. In the case of the p type ZnO, for example, ZnO is one doped with a group I element (Li, Na, K, Rb or Sc), or a group V element (N, P, As, Sb or Bi). For the n type semiconductor layer 43, for example, one may be selected from the group II oxides such as n type ZnO or the like, and the group III nitrides such as n type GaN, AlN or the like. In the case of the n type ZnO, for example, ZnO is one doped with a group III element (B, Al, Ga, In or Tl), or a group VII element (F, Cl, Br or I). The doping amount of each of such elements can be set properly according to a device dimension, a thickness, integration degree, performance or. the like. As a material for the second electrode (n type electrode) 46, for example, one similar to that for the source 12, the drain 13 or the gate 14 of the foregoing first embodiment can be used. For the first electrode (p type electrode) 45, for example, an ohmic electrode containing Au, Pt, and Ni/Ti (multilayer structure) or the like can be used.

With such constitutions, as described above with reference to the first embodiment, the thin film material of the n type semiconductor layer 43 (p type semiconductor layer if the semiconductor layer joined to the substrate 47 is a p type) and the material of the substrate 47 can be properly combined to be used such that the lattice constants of both can be matched with each other. Further, as described above with reference to the second embodiment, a buffer layer can be added between the n type semiconductor layer 43 and the substrate 47 according to the thin film material of the n type semiconductor layer 43 and the doping amount of impurities. By using a combination of materials having high lattice compatibility for all or part of the p type semiconductor layer 42, the n type semiconductor layer 43, the light emission layer 41 and the substrate 47, it is possible to manufacture a high quality semiconductor device.

In the foregoing fifth embodiment, if not specified otherwise, materials similar to those of the first and second embodiments can be used for the respective components. In addition, by using a transparent semiconductor, a light can be emitted from the light emission layer toward the upper or lower surface of the drawing. Apparently, the invention can be applied to various light emission devices including a surface emitting laser, an electroluminescence device, and so on.

(5) Surface Acoustic Wave (SAW) Device

Figure 15:
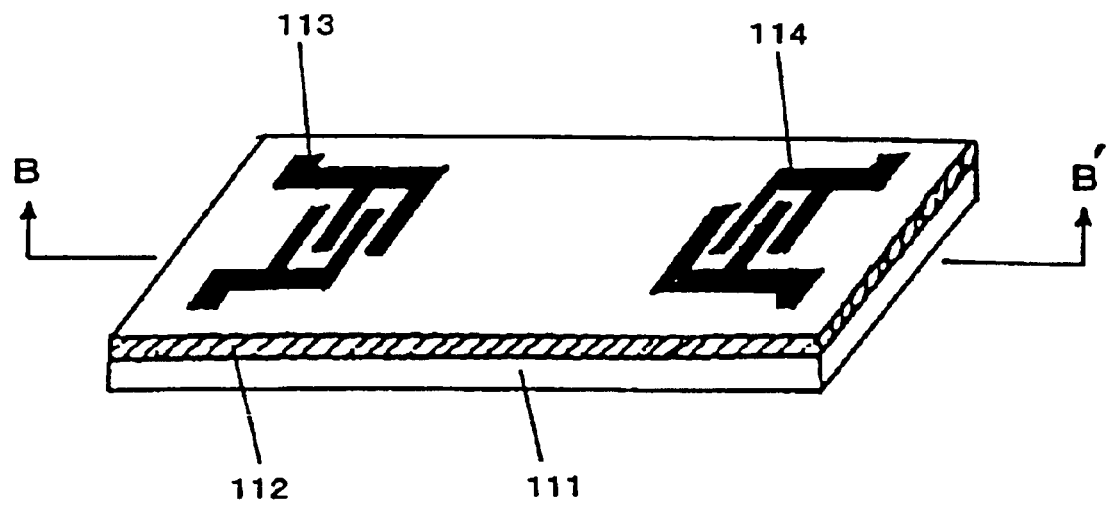
FIGS. 15A and 15B are constitutional views, each of which shows a semiconductor device according to a sixth embodiment of the invention.
Figure 15:
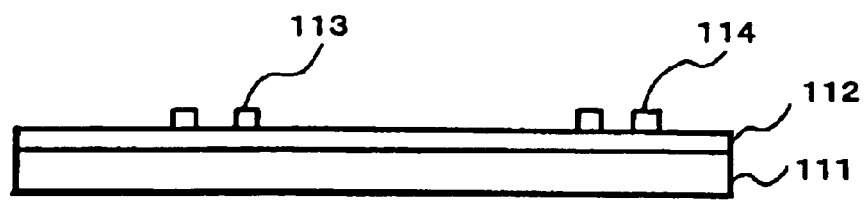

FIGS. 15A and 15B are constitutional views, each of which shows a semiconductor device according to the sixth embodiment of the invention. Specifically, FIG. 15A is a perspective view of a SAW device; FIG. 15B is a sectional view taken on line B–B' of FIG. 15A.

The SAW device comprises: a substrate 111; a semiconductor layer 112; and input and output electrodes 113 and 114. The SAW device is a semiconductor device designed to output a proper signal from the output electrode 114 based on the filter characteristic thereof when a high frequency signal is entered from the input electrode 113.

The semiconductor layer 112 is an insulating semiconductor, and a material similar to that of the first embodiment can be properly used as a base. For the semiconductor layer 112, for example, insulating ZnO undoped/doped with a group I or III element can be used. To suppress grain boundaries, for example, liId transition metal (Co, Ni or the like) may be slightly added as impurities.

With such a constitution, as described above with reference to the first and second embodiments, the thin film material of the semiconductor layer 112 and the material of the substrate 111, the input electrode 113 and the output electrode 114 can be properly combined to be used so that the lattice constants of both can be matched with each other.

(6) Other Applications

The present invention is very advantageous when applied to a laminated semiconductor device, since the surface of each layer can be formed to be very flat. In this case, the foregoing materials can be properly selected for lamination by considering compatibility between the lattice constants of each layer and a layer to be joined thereto. In addition, a plurality of transistors may be selected, and mixed for lamination.

In addition to the SAW device, the invention can be applied to an optical waveguide, an optical integrated circuit such as a diffraction grating or the like, and an optical device. The invention can also be applied to various sensors including a varistor, a humidity sensor, a temperature sensor, a gas sensor, and so on. The invention can even be applied to a memory. If the invention is applied to the memory, a memory device can be realized by arraying transistors and capacitors in a matrix form, and using each transistor to drive each capacitor. In addition, according to the invention, the proper devices including the transistor, the light emission device, the capacitor, and so on, can be formed on the same substrate. Moreover, by forming a high quality crystal, the invention can be widely applied to the semiconductor devices in many fields.

The size, thickness, dimension, or the like of the semiconductor device and the respective layers can be properly designed according to use, a process or the like. The amount of doping can be set properly according to a need, e.g., a manufacturing process, device performance or the like.

As the n and p type semiconductors and the conductive and insulating materials, the example of the semiconductor containing ZnO as a base and doped with each element was described. However, the invention is not limited to this example. In the first and second embodiments, the channel layers were formed on the substrates. However, as apparent from the other embodiments, other than the channel layer, an insulating or conductive semiconductor layer, a doped or undoped semiconductor layer, or an n or p type semiconductor layer can be formed on the substrate as occasion demands.

INDUSTRIAL APPLICABILITY

According to the present invention, since the thin film material such as group II oxide, e.g., ZnO, group III nitride, e.g., GaN, or the like, and the oxide crystal having very high lattice compatibility are used for the substrate, the quality of the thin film material can be greatly improved. Thus, it is possible to form a thin film having high quality comparable to a bulk single crystal, and to manufacture a semiconductor device having superior characteristics. Moreover, according to the invention, it is possible to form a semiconductor thin film of ZnO, GaN or the like, having almost no grain boundaries, a large grain size, small fluctuation of lattice plane spacing, very small mosaicness, and high quality substantially comparable to a single crystal.

According to the invention, since the lattice mismatching of, e.g., $ScAlMgO_4$(SCAM) crystal or the like with respect to ZnO is small (about 0.13%), a ZnO thin film of substantially a single crystal can be formed on the substrate. Moreover, according to the invention, compared with the conventional case of using the sapphire substrate or the like, ZnO on the SCAM substrate has high electron mobility, and can be approximated to a ZnO single crystal.

According to the invention, by combining ZnO as a transparent semiconductor material with the transparent highly insulating SCAM substrate, it is possible to manufacture a transparent semiconductor device, and to greatly improve the performance of the heterostructured device. Moreover, transparent materials may be properly used for part or all of various electrode materials, the insulating layers, and so on, in the FET or the like.

By applying the invention to the transistor or the like, it is possible to achieve a high switching speed. By applying the invention to the field effect transistor or the like, a depletion layer is enlarged when an electric field is applied. Thus, a gate voltage for switching can be reduced. In addition, by applying the invention to the light emission device, light emission efficiency can be increased.

Furthermore, the invention can be applied to the field effect transistor or the bipolar transistor, the GaN based light emission device (LED, laser) containing a nitride blue laser, t he Surface Acoustic Wave (SAW) device, and various electronic devices including a sensor, and so on, and it is possible to improve the performance thereof.

What is claimed is:

1. A semiconductor device comprising,
   a substrate for a basic structure containing
   (1) a material of formula $LnABO4$ or $LnAO3(BO)n$,
   wherein,
   Ln is a rare earth element,
   A is selected from the group consisting of Fe, Ga and Al;
   B is selected from the group consisting of Mn, Co, Fe, Zn, Cu, Mg, and Cd, or
   (2) a material of formula $ScAlBeO4$, $ScBMgO4$, $ScBBeO4$, or $LnAO3(MgO)n$
   wherein,
   Ln is a rare earth element,
   A is selected from the group consisting of Fe, Ga and Al and a semiconductor layer formed on said substrate, wherein said semiconductor layer is formed from a material comprising a group II metal oxide;

wherein said semiconductor layer is formed on said substrate by depositing said semiconductor layer at temperatures from 350° C. to 600° C., so as to achieve high nitrogen doping concentration therein.

2. A semiconductor device as claimed in claim 1, wherein said substrate for a basic structure contains (1) a material of formula LnABO4 or LnAO3(BO)n, wherein, Ln is a rare earth element, A is selected from the group consisting of Fe, Ga and Al, B is selected from the group consisting of Mn, Co, Fe, Zn, Cu, Mg, and Cd.

3. The semiconductor device as claimed in claim 2, wherein Ln is selected from the goup consisting of Sc, In, Lu, Yb, Tm, Ho, Er and Y.

4. The semiconductor device as ciaimed in claim 2, wherein the group II metal oxide is selected from the group consisting of zinc oxide (ZnO), zinc magncsiwn oxide ($Mg_xZn_{1-x}O$), zinc cadmium oxide ($Cd_xZn_{1-x}O$) and cadmium oxide (CdO).

5. The semiconductor device according to claim 2, wherein said substrate is a material selected from the group consisting of $ScAlMgO_4$, $ScAlZnO_4$, $ScAlCoO_4$, $ScAlMnO_4$, $ScGaZnO_4$, $ScGaMgO_4$, $ScAlZn_3O_6$, $ScAlZn_4O_7$, $ScAlZn_7O_{10}$, $ScGaZn_3O_6$, $ScGaZn_5O_8$, $ScGaZn_7O_{10}$, $ScFeZn_2O_5$, $ScFeZn_3O_6$, and $ScFeZn_6O_9$, and, ZnO is used as a matal for said semiconducior layer.

6. The semiconductor device according to claim 2, wherein said substrate is a material selected from the group consisting of $ScAlO_n$, $(ZnO)_n$, $ScFeO_3(ZnO)_n$, $ScGaO_3(ZnO)_n$, $InFeO_3(ZnO)_n$, $InGaO_3(ZnO)_n$, $InAlO_3(ZnO)_n$, $YbAlO_3(ZnO)_n$, and $LuAlO_3(ZnO)_n$, and, ZnO is used as a material for said semiconductor layer.

7. The semiconductor device according to claim 2, further compriing a buffer layer, between said substrate and said semiconductor layer, wherein said buffer layer contains a material having a composition or a structure identical to that of said semiconductor layer as a base and slightly doped or undoped with impurities.

8. The semiconductor device according claim 7, wherein ZnO is used for said semiconductor layer, and said buffer layer is an insulating material slightly doped with an element capable of taking valence of 1 value or a group V element, an insulating material containing undoped and pure insulating ZnO or a combination thereof.

9. The semiconductor device according to claim 8, wherein said buffer layer is ZnO.

10. The semiconductor device according to claim 2, further comprising an insulating layer formcd by using a material identical to that for said substrate for a basic structure.

11. The semiconductor device according to claim 2, further comprising a light emission layer formed on said semiconductor layer by using a material having a composition or a structure identical to that of said semiconductor layer as a base, and a second semiconductor layer which is formed on said light emission layer by using a material having a composition or a structure identical to that of said semiconductor layer, and which has carriers that have a different conductive sign from carriers of said semiconductor layer.

12. The semiconductor device according to claim 11, wherein said light emission layer is sclected from the group consisting of a multilayer structure of (Mg, Zn)O and ZnO, a multilayer structure of (Zn, Cd)O and ZnO, and a multilayer structure of (Mg, Zn)O and (Zn, Cd)O.

13. The semiconductor device according to claim 2, wherein input and output electrodes are further formed on said semiconductor layer.

* * * * *

UNITED STATES PATENT AND TRADEMARK OFFICE
CERTIFICATE OF CORRECTION

PATENT NO. : 6,878,962 B1
DATED : April 12, 2005
INVENTOR(S) : Kawasaki et al.

Page 1 of 1

It is certified that error appears in the above-identified patent and that said Letters Patent is hereby corrected as shown below:

Column 12,
Line 56, reading "(1) a material of formula LnABO4 or LnAO3(BO)n," should read -- (1) a material of formula $LnABO_4$ or $LnAO_3(BO)_n$, --;
Line 59, reading "Fe, Ga and Al;" should read -- Fe, Ga and Al, --;
Lines 62-63, reading "(2) a material of formula ScAlBeO4, ScBMgO4, ScBBeO4, or LnAO3(MgO)n" should read -- (2) a material of formula $ScAlBeO_4$, $ScBMgO_4$, $ScBBeO_4$, or $LnAO_3(MgO)_n$ --;
Line 66, reading "A is selected from the group consisting of Fe, Ga and Al" should read -- A is selected from the group consisting of Fe, Ga and Al; --;

Column 13,
Line 11, reading "(1) a material of formula LnABO4 or LNAO3(BO)n," should read -- (1) a material of formula $LnABO_4$ or $LNAO_3(BO)_n$, --;
Line 19, reading "goup" should read -- group --;
Line 21, reading "ciaimed" should read -- claimed --;
Line 23, reading "magncsiwn" should read -- magnesium --;
Line 35, reading "matal" should read -- material --;
Line 35, reading "semiconducior" should read -- semiconductor --;
Line 38, reading "ScAlO$_n$, (ZnO)$_n$," should read -- $ScAlO_3(ZnO)_n$ --;

Column 14,
Line 2, reading "compriing" should read -- comprising --;
Line 34, reading "sclected" should read -- selected --.

Signed and Sealed this

Thirtieth Day of August, 2005

JON W. DUDAS
*Director of the United States Patent and Trademark Office*